United States Patent [19]

Smith

[11] Patent Number: 4,886,461

[45] Date of Patent: Dec. 12, 1989

[54] ZERO INSERTION FORCE ELECTRICAL CONNECTOR

[75] Inventor: Robert T. Smith, Roundrock, Tex.

[73] Assignee: Microelectronics and Computer Technology Corporation, Austin, Tex.

[21] Appl. No.: 258,930

[22] Filed: Oct. 17, 1988

Related U.S. Application Data

[63] Continuation of Ser. No. 95,972, Sep. 14, 1987, abandoned.

[30] Foreign Application Priority Data

Oct. 11, 1986 [GB] United Kingdom ............... 8626827

[51] Int. Cl.$^4$ ............................................. H05K 1/00
[52] U.S. Cl. ...................................... 439/67; 439/260; 439/77
[58] Field of Search ............................ 439/55, 59–62, 439/65, 66, 67, 77, 492–499, 259, 260, 329

[56] References Cited

U.S. PATENT DOCUMENTS

| | | | |
|---|---|---|---|
| 2,956,258 | 10/1960 | Raddin | 439/197 |
| 3,316,618 | 5/1967 | Guarracini | 439/65 |
| 4,019,798 | 4/1977 | Zielinski | 439/67 |
| 4,289,364 | 9/1981 | Strom et al. | 439/67 |
| 4,714,435 | 12/1987 | Stipanuk et al. | 439/497 |

Primary Examiner—David Pirlot
Attorney, Agent, or Firm—Fulbright & Jaworski

[57] ABSTRACT

A zero insertion force electrical connector for electrically connecting two electrical members. A plurality of first electrical contacts on a first member engage a plurality of second electrical on a second member. An isostatic medium is retained against the second member and a pressure generator acts on the isostatic medium for providing a uniform force forcing the first and second contact into engagement. One of the first and second contacts may be positioned in recesses and the other of the first and second contacts are outwardly extending for providing self-alignment between the first and second members. The second member may be a three-layer tape having a first metal signal layer, a middle dielectric layer and a second ground layer for interconnection to a third electrical member.

3 Claims, 7 Drawing Sheets

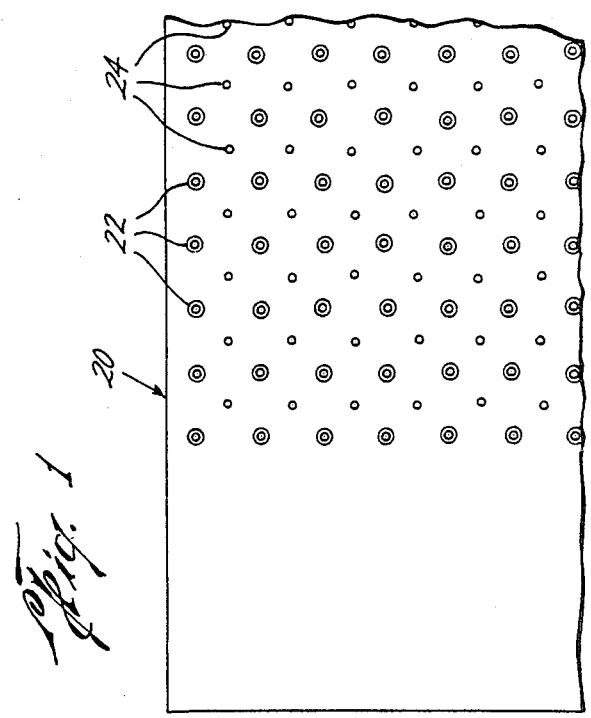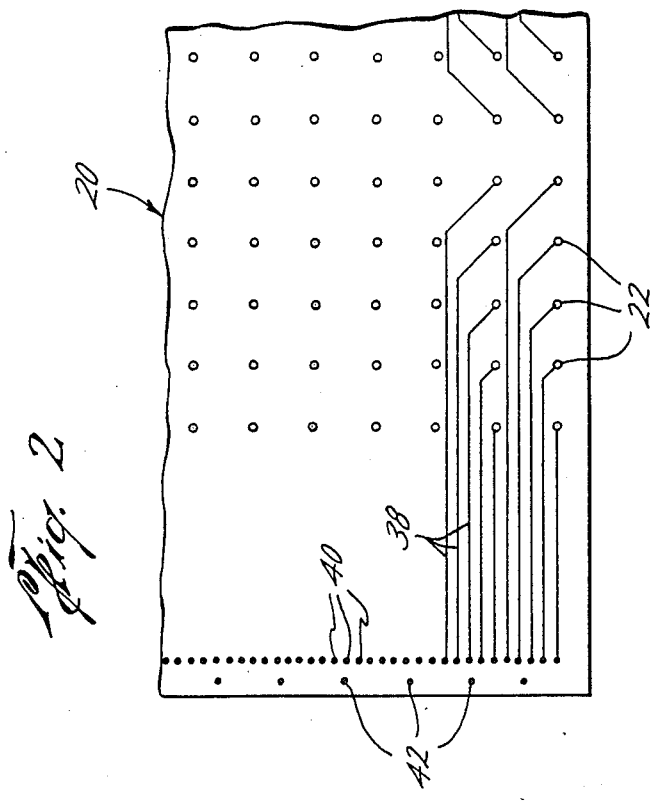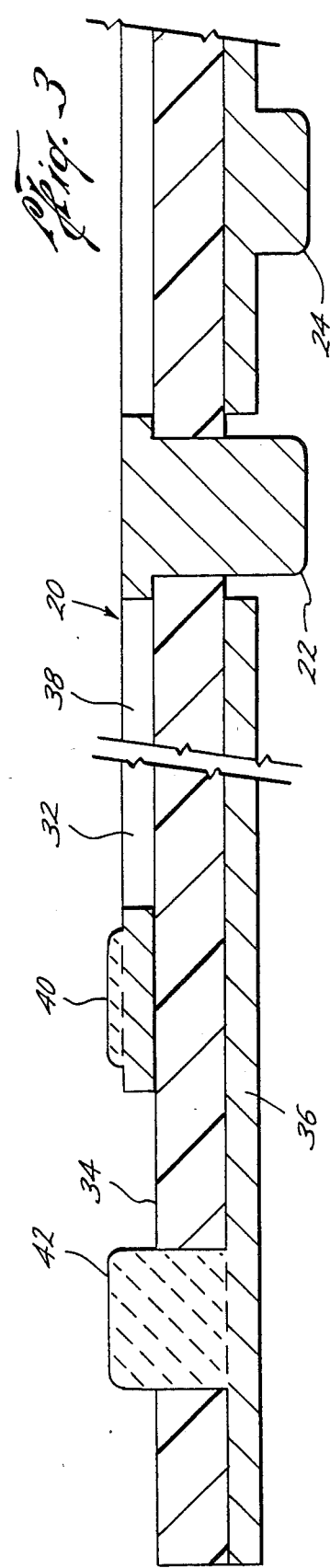

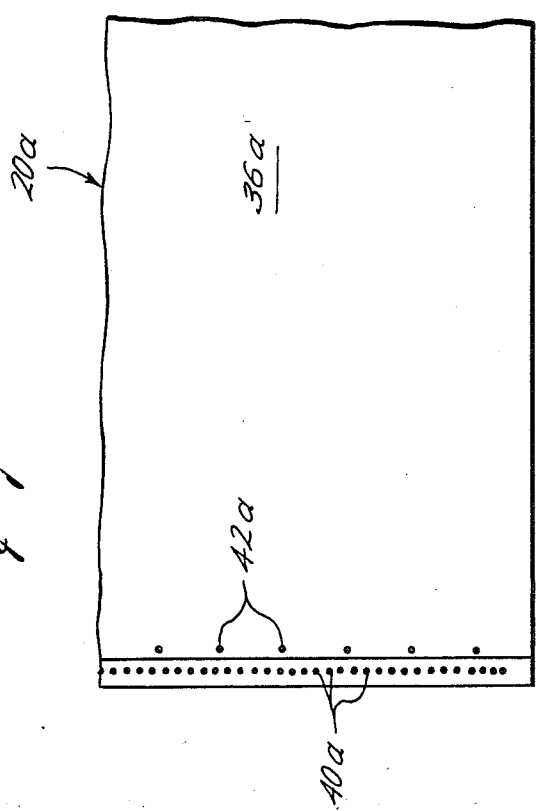
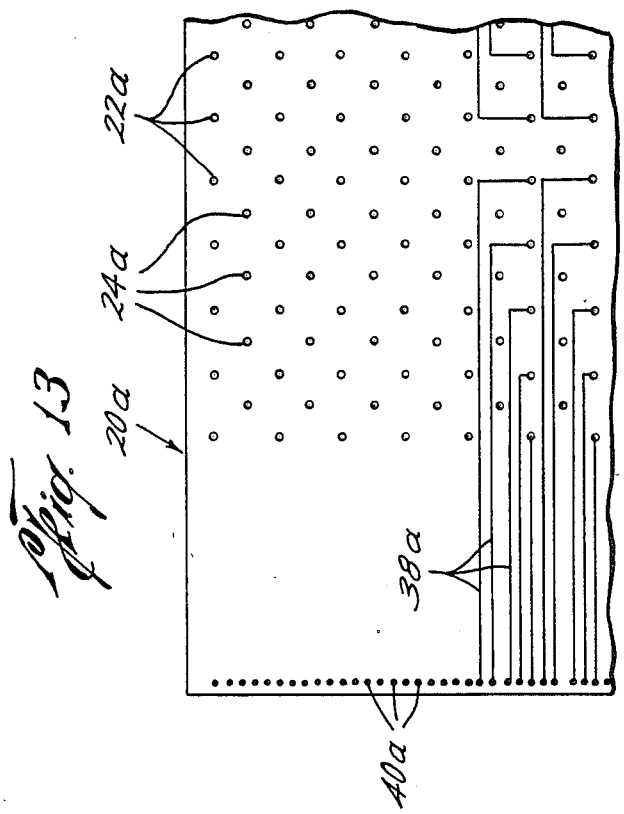
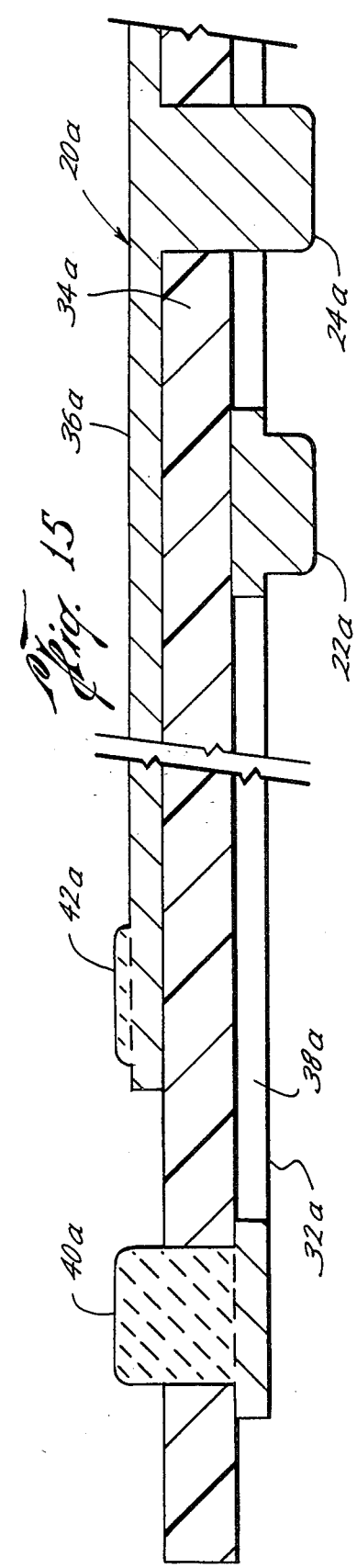

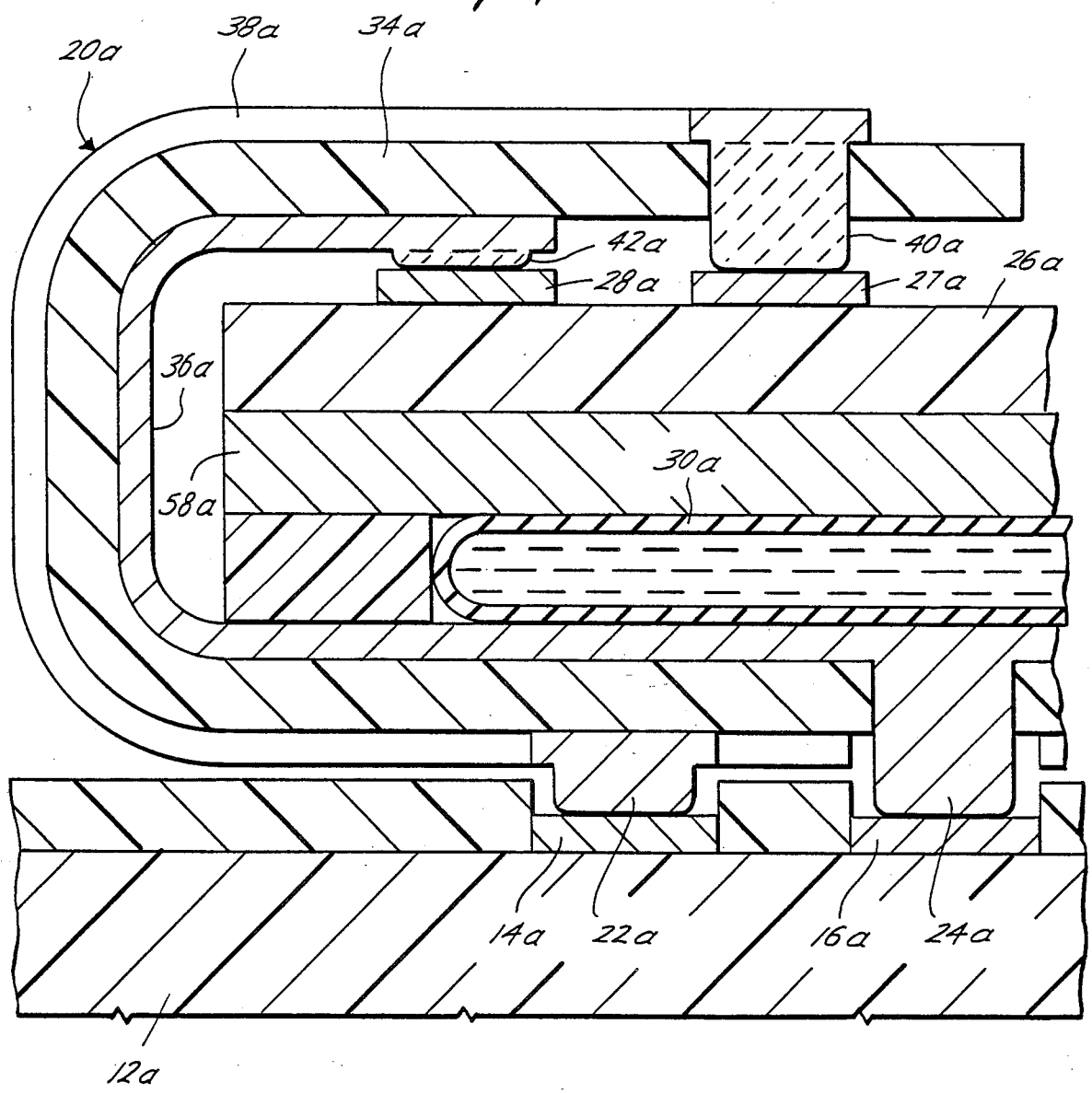

ZERO INSERTION FORCE ELECTRICAL CONNECTOR

This is a continuation of Ser. No. 095,972, filed Sept. 14, 1987, now abandoned.

BACKGROUND OF THE INVENTION

The present invention is directed to a zero insertion force electrical connector for electrically connecting first and second electrical members, each of which includes first and second electrical contacts, respectively, which are placed in engagement. An isostatic medium is positioned against one of the members and is retained there by retaining means and a pressure generating means acts on the isostatic medium for providing a uniform force forcing the first and second electrical contacts into engagement This advantageously provides a normal force at all contact locations for making a good contact independent of warpage or non-parallelism between the mating contacts. The present invention is particularly useful for connecting a three layer tape having a first metal signal layer, a middle dielectric layer, and a third ground plane layer into a rematable connection with another electrical member. The tape is particularly useful for connection to a third electrical member, called a minisubstrate, having various electrical components for electrical connection to the first electrical member.

Self-alignment between the first and second members may be readily obtained by raised contacts on one of the members which seat within corresponding recesses containing contacts on the other member.

SUMMARY

The present invention is directed to a zero insertion force electrical connector for electrically connecting two electrical members. A first member is provided having a plurality of first electrical contacts and a second member is positioned against the first member and includes a plurality of second electrical contacts on the first side for being placed in engagement with the first contacts. An isostatic medium is positioned against the second side of the second member and retaining means are provided for holding the isostatic medium in engagement against the second side of the second member. Pressure generating means acts on the isostatic medium for providing a uniform force forcing the first and second contacts into engagement.

Still a further object of the present invention is wherein one of the first and second contacts are positioned in recesses and the other of the first and second contacts are outwardly extending for providing self-alignment between the first and second members.

Yet a still further object of the present invention is wherein the second member is a three layer tape having a first metal signal layer, a middle dielectric layer, and a second ground layer.

Yet a still further object of the present invention is wherein the isostatic medium is a bladder containing a substantially incompressible fluid.

Yet a still further object is the provision of a third electrical member positioned adjacent the side of the isostatic medium remote from the second member and the third member includes a plurality of third electrical contacts electrically connected to the second contacts.

Still a further object of the present invention is wherein the retaining means includes a retainer surrounding the sides of the isostatic medium, a support plate engaging the top of the isostatic medium and supporting the third electrical member, and a lid secured to the first member and engaging the support plate.

Other and further objects, features and advantages will be apparent from the following description of presently preferred embodiments of the invention, given for the purpose of disclosure, and taken in conjunction with the accompanying drawings.

BRIEF DESCRIPTION OF THE DRAWINGS

FIG. 1 is a fragmentary elevational view of the bottom side of one of the electrical members to be connected, FIG. 2 is a fragmentary elevational view of the top side of the member of FIG. 1, FIG. 3 is an enlarged fragmentary cross-sectional view of the member of FIGS. 1 and 2, FIG. 13 is a fragmentary elevational view of the bottom of another embodiment of an electrical member to be connected, FIG. 14 is a fragmentary elevational view of the top of the member of FIG. 13, FIG. 15 is an enlarged fragmentary cross-sectional view of the member of FIGS. 13 and 14, and FIG. 16 is an enlarged fragmentary cross-sectional view of the use of the members 13, 14 and 15 in an electrical connection.

DESCRIPTION OF THE PREFERRED EMBODIMENT

While the present invention will be described in connection with providing a key zero insertion force connection between a three layer tape to a printed circuit board, such as a microwave substrate, in which a uniform contact force between contacts on the tape and the substrate is provided by an isostatic medium for purpose of illustration, it is to be understood that the present zero insertion force electrical connector may be used for electrically connecting various types of electrical members.

Figure 11:
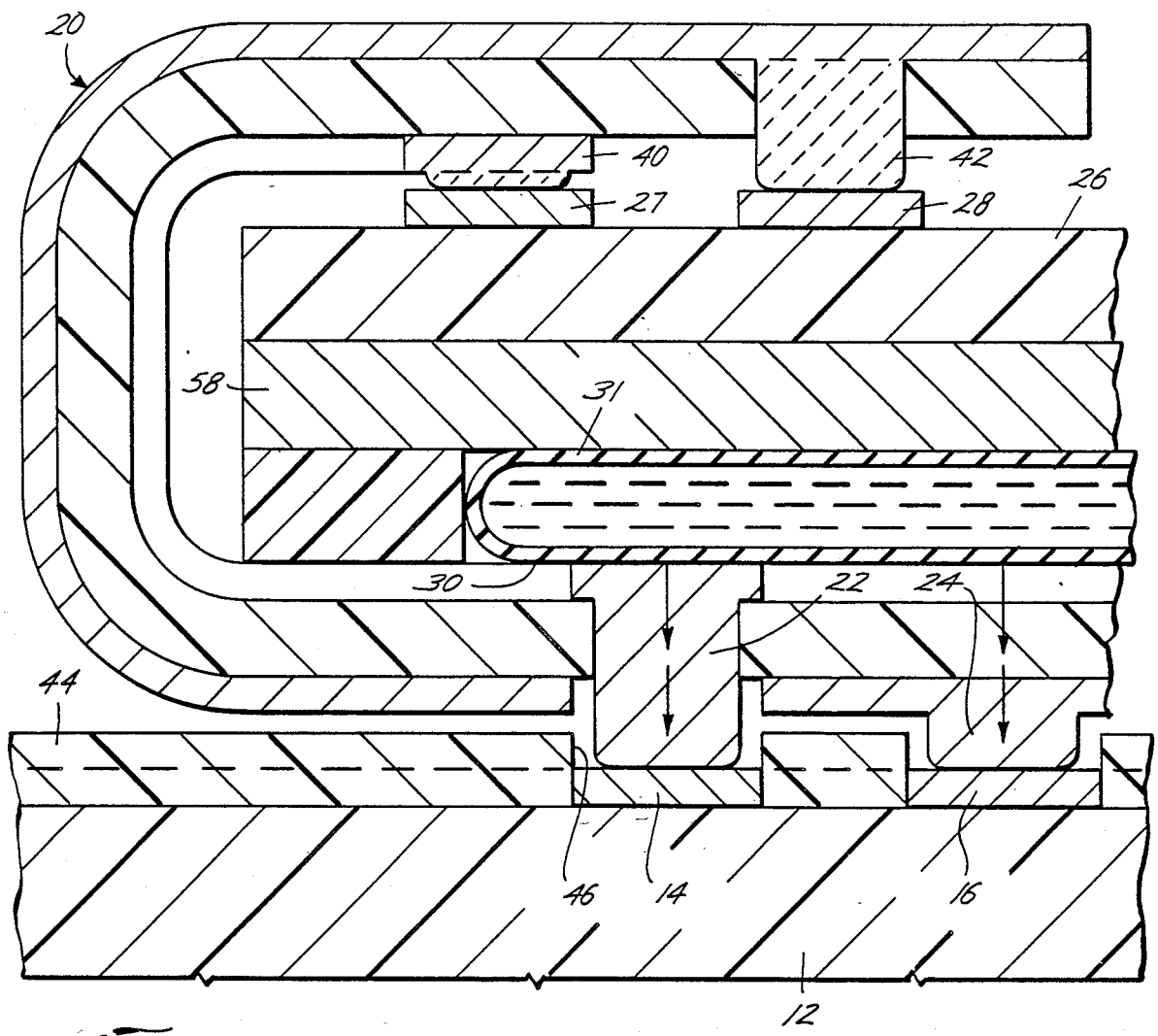
FIG. 11 is an enlarged detailed vie of the detail 11 of FIG. 10.

Referring now to the drawings, the zero insertion force electrical connector 10 (FIGS. 4, 5, 6, 7, 8, 9 and 10) is particularly useful in interconnecting a first electrical member 12 (FIG. 11) such as a microwave substrate or printed circuit board having a plurality of electrical contacts, such as signal contacts 14 and ground contacts 16, to a second electrical tape member generally indicated by the reference numeral 20 having a plurality of signal contacts 22 and ground contacts 24 in which the contacts 14 and 16 may be engaged by the contacts 22 and 24, respectively, with a zero force. Thereafter the contacts are loaded to a proper uniform normal force by means of an isostatic medium generally indicated by the reference numeral 30. The printed circuit board 12 may be any suitable material with useful high performance electrical as well as mechanical properties such as multilayer microwave substrate structures of Teflon-fiberglas mat-copper, multiple layer polyimide-copper constructions, and micro-coaxial additive wire boards. The second electrical member 20 may also be adapted to be electrically connected to a third electrical member such as a minisubstrate 26, which could be of glass or ceramic construction for example, having electrical contacts 27 and 28.

Referring now to FIGS. 1, 2 and 3, the structure of the second electrical tape member 20 is best seen which is preferably a three layer tape having a first metal signal layer 32, a middle dielectric layer 34 and a third ground layer 36. Preferably, the layers 32, 34 and 36 are a copper signal layer, polyimide, and a copper ground plane, respectively, although other materials may be used. The first layer 32 consists of a plurality of microstrip conductor traces 38 each of which is connected to one of the second contacts 22 which, for example only, are positioned on 30 mil centers or more on a square grid. The second end of the traces 38 are connected to a row of electrical contacts 40, for example!e, on 10 mil centers or less adjacent the outer edge of the tape connector 20, to form electrical connectors for connecting to the contacts 27 on the substrate 26 (FIG. 11) by conventional surface mount techniques, such as soldering or by outer lead bonding, such as thermo sonic bonding. For example only, if the dielectric layer 34 is two mils in thickness, an estimate for the microstrip traces 38 width is 4 mil for a 50 ohm line.

The ground plate 36 is connected to a plurality of ground contacts 24 and is connected to an outer row of ground contacts 42 for connection with the contacts 28 of the substrate 26 (FIG. 11) such as by conventional surface mount techniques.

Referring again to FIG. 11, it is to be noted that the first electrical connector 12 and the second electrical connector 20 achieve self-alignment by having raised or outwardly extending contacts in one of the members and corresponding recesses in the other. As shown, the contacts 22 and 24 on the tape member 20 are preferably outwardly extending or raised and coact with recesses in the first member 12 which can be obtained by profiling the surface of the member 12 or preferably, as shown, by providing a dielectric layer 44 having a plurality of windows 46 for receiving the contacts 22 and 24. Alternatively, contacts 14 and 16 could be raised and contacts 22 and 24 provided in recesses.

Figure 4:
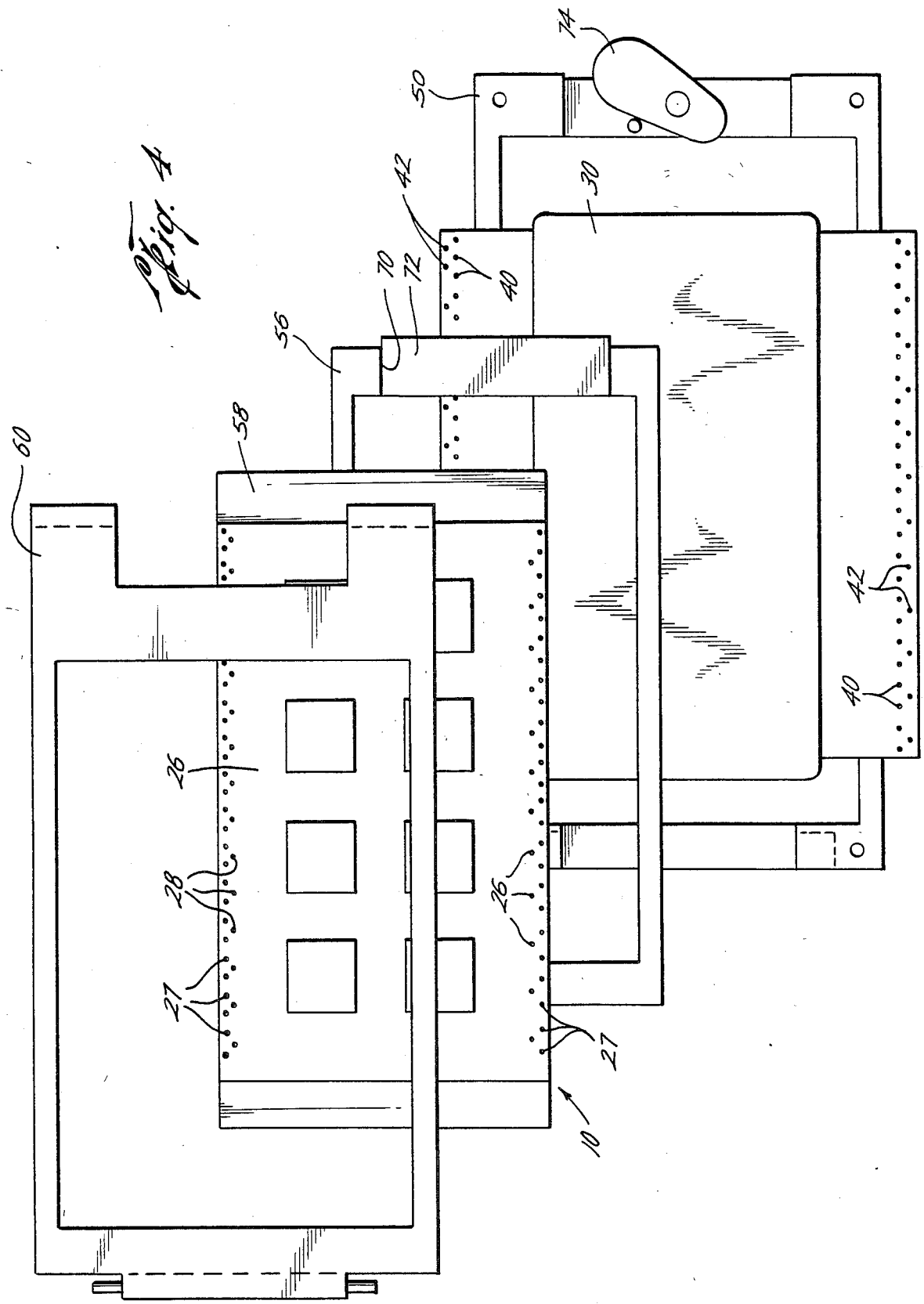
FIG. 4 is an exploded plan view of the connector of the present invention.
Figure 5:
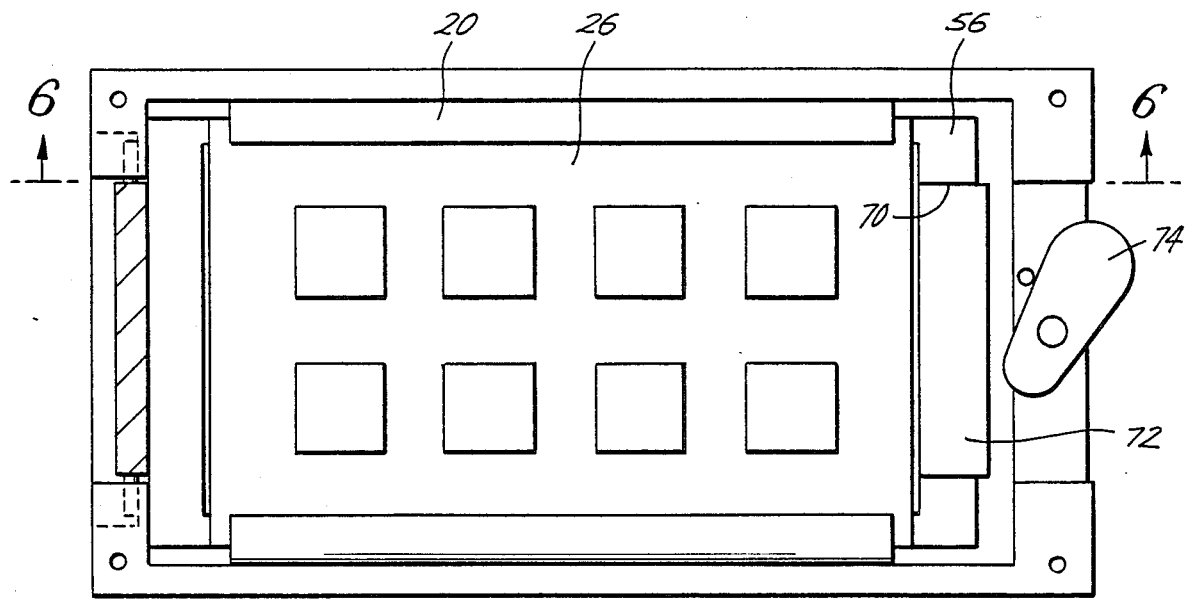
FIG. 5 is an elevational plan view of a portion of the assembly of the connector of FIG. 4 with the hinge lid removed.
Figure 6:
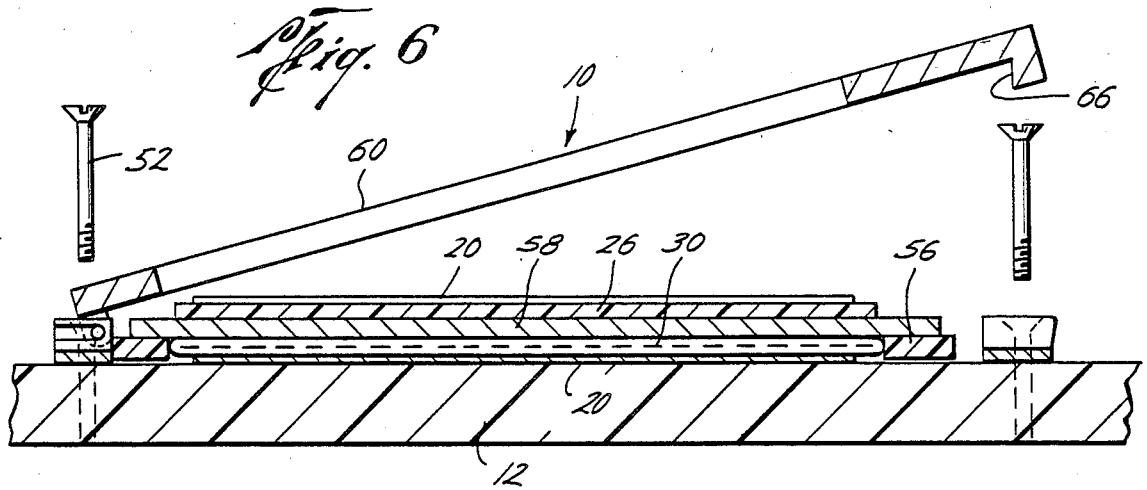
FIG. 6 is a cross-sectional view taken along the line 6—6 of FIG. 5 showing the lid, attached and raised, with attachment screws ready to be inserted.
Figure 7:
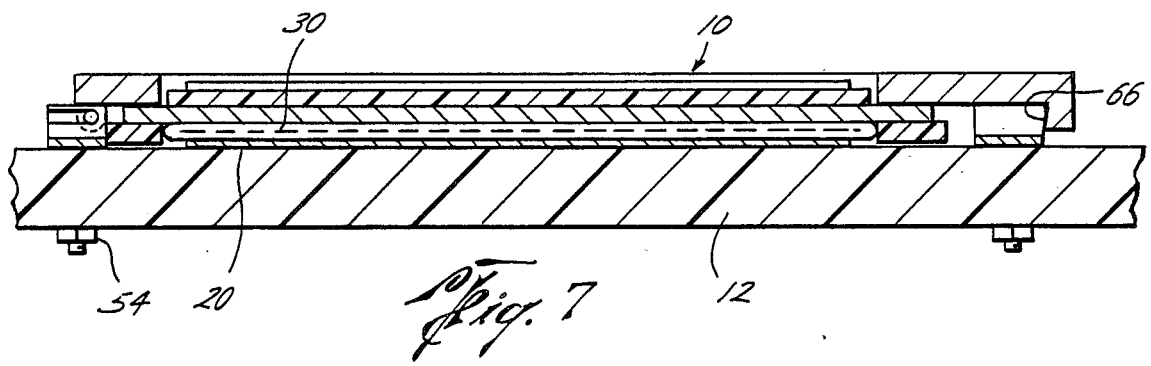
FIG. 7 is a cross-sectional view similar to FIG. 6 with the lid in a downward position and locked.
Figure 8:
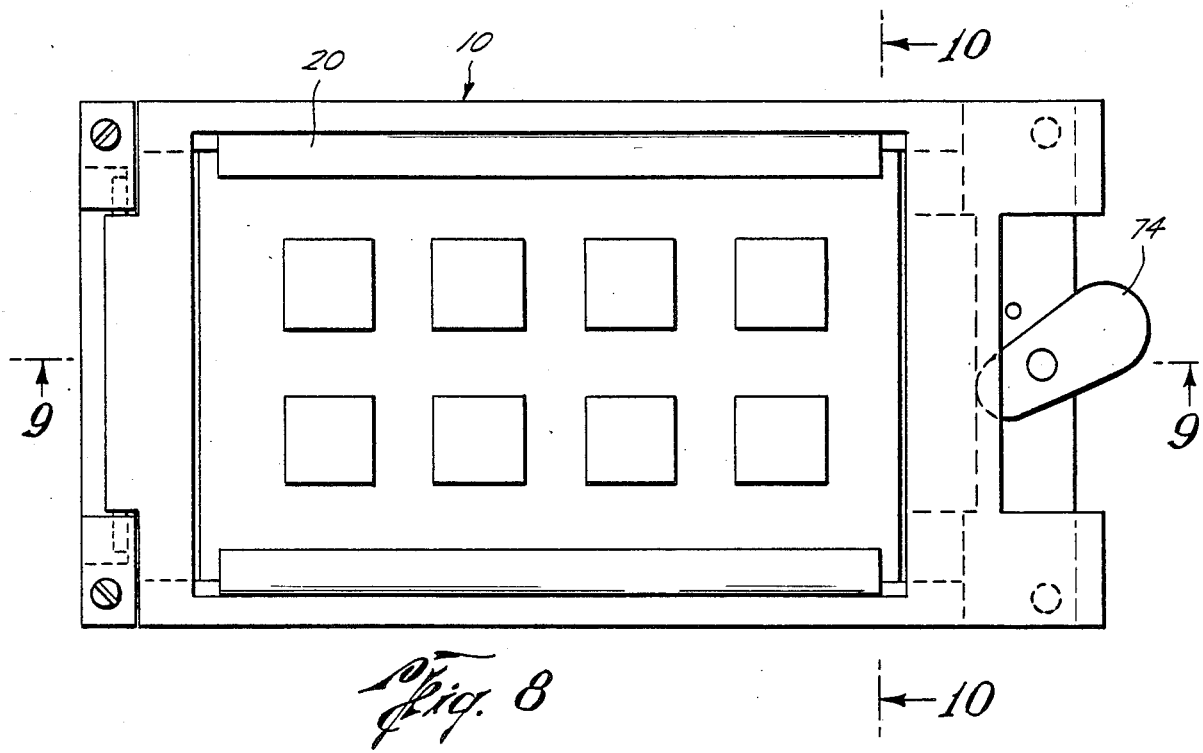
FIG. 8 is an elevational plan view of the apparatus of FIG. 7.
Figure 9:
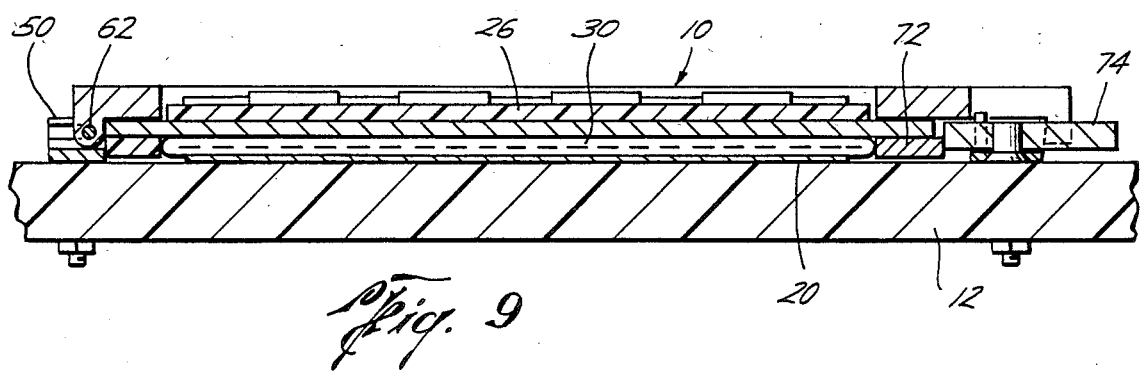
FIG. 9 is a cross-sectional view taken along the line 9—9 of FIG. 8.
Figure 10:
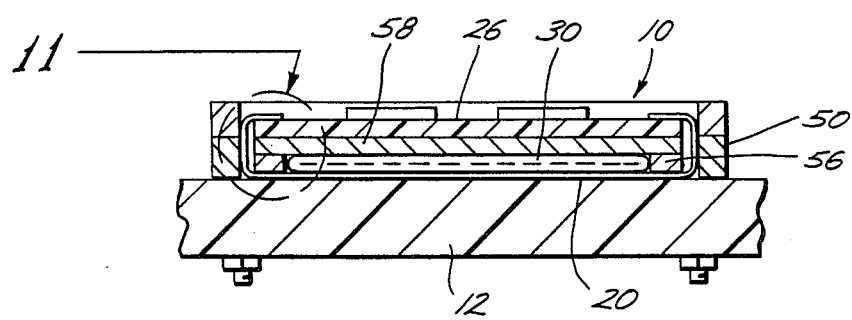
FIG. 10 is a cross-sectional view taken along the line 10—10 of FIG. 8.

Referring now to FIGS. 4, 5, 6, 7, 8 and 9, the connector 10 of the present invention includes a mounting member 50 which is secured to the substrate 12 such as by bolts 52 and nuts 54 (FIGS. 6 and 7). A retainer member 56 is supported in the mounting member 50 and supports the outer edges of the isostatic medium 30. A supporting plate 58 is positioned over the retainer 56 and supports the minisubstrate 26. In addition, a hinged lid 60 which is pivotally connected at pivot 62 to the mounting board 50 is provided and includes a releasable lock 66 for locking to the mounting support 50. Thus, the members 50, 56, 58 and 60 act as retainer means for holding the isostatic medium 30 in engagement with the second side of the tape electrical member 20. The isostatic medium 30 advantageously provides means for loading the engagement of the first contacts 14 and 16 of the first member 12 against the second contacts 22 and 24 of the second member 20 by uniform normal force.

The advantages of the isostatic pressure medium 30 (Poisson No. substantially = $\frac{1}{2}$) includes the following:
1. The medium 30 exhibits isotropy. This means that the same normal force is established at all of the contact locations and is independent of warpage or nonparallelism between the first member 12 and the second member 20;
2. An isostatic medium behaves as a Pascals Law fluid. By transmission of a uniform pressure throughout the medium such a medium can allow a small initiation force to result in the transmission of a much larger force at a distance according to the ratio of areas. As an isostatic pressure can be initiated orthogonally to the direction of the normal contact forces of the coacting contacts, there need not be relative motion between the printed circuit board 12 member and the tape member 20 as contact is made;
3. The medium 30 can be temperature compensated by, for example, the use of a Hook's law device attached to a piston to allow it to yield as the isostatic medium 30 expands as a function of temperature.

The isostatic medium 30 is of an incompressible (or slightly compressible) liquid, gel, wax, polymer, rubber or the like and may be retained between the retainer 56 and support plate 58 or within a bladder 31. For example, a flexible bladder containing water may be used. Another type of satisfactory medium would be an elastomer.

Figure 12:
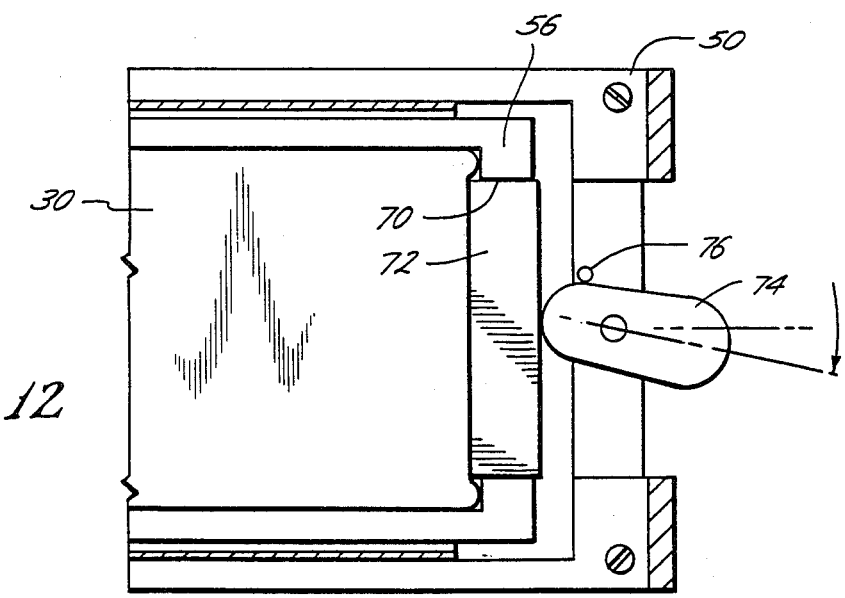
FIG. 12 is an elevational view of a portion of the connector in its activated position.

Any suitable means for applying a pressure generating force on the isostatic medium 30 may be provided. For example, the space in the retainer 56 may be such that merely locking the lid 60 which exerts a force on the support plate 58 and medium 30 would provide the necessary pressure generation. However, as shown in the drawings, the retainer 56 includes a slot 70 in which a sliding element or piston 72 is movable for engaging and compressing the isostatic medium 30. The piston 72 may be actuated by a cam 74 which moves from a retracted position as best seen in FIGS. 5, 6 and 7 to a past dead center position against pin 76 to pressure generating position, as best seen in FIG. 12, to engage the piston 72 and move it against the medium 30 to compress the medium. Compression of medium 30 will transmit a uniform isostatic pressure to all surfaces in contact with the medium 30 including the second electrical contacts 22 and 24. Other means of initiation of the isostatic pressure such as a shape memory metal, such as can be fabricated from nickel-titanium alloys, could also be used. The isostatic pressure in the region of the tape member 20 adjacent to the printed circuit board 12, to which contact is made, will insure that all of the contacts will achieve nearly identical normal forces within the limit of several mil variations in planearity over the footprint of the medium 30.

In use, the mounting support 50 is secured to the first electrical member or printed circuit board 12 and the second electrical member such as the tape member 20 is positioned with the second contacts 22 and 24 in engagement with the first contacts 14 and 16, respectively, to provide a self-alignment between the members 12 and 20. Thus, the tape member 20, the isostatic medium 30, the retainer 56, support plate 58 and the third electrical member or minisubstrate 26 (with its contacts 27 and 28 bonded to the contacts 40 and 42 of the tape connector) are inserted in the mount 50. Thereafter the lid 60 is closed and the pressure generating means such as cam 74 is actuated to move the piston 72 into engagement with the isostatic medium 30 for insuring a uniform force contact between the members 12 and 20.

Other and further embodiments may be provided. For example, as best seen in FIGS. 13, 14, 15 and 16, a different second electrical connector may be provided wherein like parts to those shown in FIGS. 1-3 are similarly numbered with the addition of the suffix "a". In this embodiment, the tape connector 20a is again a three layer tape in which the ground layer 36a is on the top and the third layer 32a, which consists of the signal traces 38a, is on the bottom. Again, the rematable contacts 22a and 24a of the connector 20a coact with the contacts 14a and 16a, respectively, of the connector 12a and are loaded into contact with each other by the isostatic medium 30a. The contacts 40a and 42a of the connector 20a may be bonded to the contacts 27a and 28a, respectively, on the minisubstrate 26a by conventional outer lead bonding.

The present invention, therefore, is well adapted to carry out the objects and attain the ends and advantages mentioned as well as others inherent therein. While presently preferred embodiments of the invention have been given for the purpose of disclosure, numerous changes in the details of construction and arrangement of parts will be readily apparent to those skilled in the art and which are encompassed within the spirit of the invention and the scope of the appended claims.

What is claimed is:

1. A zero insertion force electrical connector comprising,
   a first electrical substrate having a plurality of first electrical contacts recessed in windows,
   a flexible three layer tape having a first metal signal layer, a middle dielectric layer, and a third ground layer, said tape including a plurality of second electrical contacts extending outwardly from a first side for engaging said first electrical contacts, each of said second contacts connected to one of the first and third layers, and electrical connections at the outer edges of said tape connected to the first metal signal layer and to the third ground layer,
   an isostatic medium positioned against the second side of the tape,
   retaining means holding the isostatic medium in engagement against the second side of the tape,
   pressure generating means acting on the isostatic medium for providing a uniform force forcing the first and second contacts in engagement, and
   a second electrical substrate electrically connected to the electrical connections on the tape.

2. The apparatus of claim 1 wherein the retaining means includes,
   a retainer surrounding the sides of the isostatic medium,
   a support plate engaging the top of the isostatic medium and supporting the second electrical substrate, and
   a lid secured to the first substrate and engaging the support plate.

3. The apparatus of claim 1 wherein the electrical connections at the outer edges of the tape are bonded to the outer edges of the second electrical substrate.

* * * * *